United States Patent
Chang

(10) Patent No.: US 9,261,734 B2
(45) Date of Patent: Feb. 16, 2016

(54) DISPLAY APPARATUS WITH UNIFORM CELL GAP

(75) Inventor: Jongwoong Chang, Asan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 1289 days.

(21) Appl. No.: 12/898,562

(22) Filed: Oct. 5, 2010

(65) Prior Publication Data

US 2011/0115765 A1    May 19, 2011

(30) Foreign Application Priority Data

Nov. 19, 2009 (KR) .................. 10-2009-0112094

(51) Int. Cl.
*G02F 1/1339* (2006.01)
*G02F 1/1345* (2006.01)
*G06F 3/038* (2013.01)
*H01L 23/48* (2006.01)

(52) U.S. Cl.
CPC ............ *G02F 1/1339* (2013.01); *G02F 1/1345* (2013.01); *G02F 1/13392* (2013.01); *G02F 1/13394* (2013.01); *G02F 2001/13396* (2013.01); *G09G 2300/0408* (2013.01); *H01L 2224/48091* (2013.01)

(58) Field of Classification Search
CPC .............. G02F 1/13394; G02F 1/1339; G02F 1/13452; G02F 1/1345; G02F 1/13454; G02F 2001/133388; G02F 1/13392; G02F 1/13458; G02F 1/136227; G02F 1/13624; G02F 2001/13396; G02F 2001/133354; G02F 2001/01; G09G 2310/027; G09G 3/3233; G09G 3/3611; G09G 2300/0426; G09G 5/006; G09G 2300/0408; G09G 3/3685; G09G 3/3266; G09G 3/3275; G09G 5/003; G09G 3/2096; G09G 3/3406; G09G 3/3674; G09G 2310/0283; G09G 3/2092
USPC ................... 257/695; 349/153, 155, 156, 157
See application file for complete search history.

(56) References Cited

U.S. PATENT DOCUMENTS

| | | | |
|---|---|---|---|
| 6,055,034 A | 4/2000 | Zhang et al. | |
| 6,249,333 B1 | 6/2001 | Zhang et al. | |
| 7,142,273 B1 | 11/2006 | Zhang et al. | |
| 7,298,447 B1 * | 11/2007 | Zhang et al. | 349/155 |

(Continued)

FOREIGN PATENT DOCUMENTS

| | | |
|---|---|---|
| JP | 3640224 B2 | 1/2005 |
| JP | 3792685 B2 | 4/2006 |

(Continued)

*Primary Examiner* — Paisley L Arendt
*Assistant Examiner* — Angela Davison
(74) *Attorney, Agent, or Firm* — Innovation Counsel LLP

(57) ABSTRACT

A display apparatus includes a first base substrate having a display area and a peripheral area divided into a first peripheral area and a second peripheral area, a second base substrate facing the first base substrate, a pixel arranged in the display area, a first driver arranged in the first peripheral area to apply a driving signal to the pixel, a coupling member disposed in the peripheral area to couple the first base substrate to the second base substrate, and a cell gap compensation pattern disposed in the second peripheral area. The cell gap compensation pattern reduces the difference between a cell gap of the display area adjacent to the first peripheral area and a cell gap of the display area adjacent to the second peripheral area, thereby uniformly maintaining the cell gap of the display apparatus to improve a display quality.

21 Claims, 12 Drawing Sheets

(56) References Cited

U.S. PATENT DOCUMENTS

| | | | |
|---|---|---|---|
| 7,612,856 B2 * | 11/2009 | Otose et al. | 349/153 |
| 7,773,181 B2 * | 8/2010 | Ko et al. | 349/139 |
| 2006/0192915 A1 * | 8/2006 | Kimura | 349/151 |
| 2006/0290859 A1 * | 12/2006 | Ko et al. | 349/139 |
| 2008/0067510 A1 * | 3/2008 | Tsai et al. | 257/59 |

FOREIGN PATENT DOCUMENTS

| KR | 10-1998-0025130 | 7/1998 |
|---|---|---|
| KR | 10-2008-0088119 | 10/2008 |

* cited by examiner

DISPLAY APPARATUS WITH UNIFORM CELL GAP

CROSS-REFERENCE TO RELATED APPLICATION

This application relies for priority upon Korean Patent Application No. 2009-112094 filed on Nov. 19, 2009, the content of which is herein incorporated by reference in its entirety.

BACKGROUND

1. Field of the Invention

The present invention relates to a display apparatus. More particularly, the present invention relates to a display apparatus capable of improving a display quality.

2. Description of the Related Art

Various flat panel display apparatuses, such as liquid crystal displays, plasma display apparatuses, and organic light emitting displays are becoming increasingly widely used.

Among these flat panel display apparatuses, a liquid crystal display includes a liquid crystal layer disposed between two substrates. A liquid crystal display controls the amount of light that is transmitted through the liquid crystal layer to display a desired image.

In general, in order to maintain a uniform cell gap between the substrates, a spacer is formed between the two substrates in a display area of the apparatus.

SUMMARY

The invention provides a display apparatus capable of maintaining a uniform cell gap to improve display quality.

According to the embodiments, a display apparatus includes a first base substrate that has a display area and a peripheral area adjacent to the display area and including a first peripheral area and a second peripheral area, a second base substrate facing the first base substrate. Also, the display apparatus includes a pixel arranged in the display area and a first driver arranged in the first peripheral area to apply a driving signal to the pixel. In addition, the display apparatus includes a coupling member disposed between the first base substrate and the second base substrate in the peripheral area to cover the first driver and couple the first base substrate and the second base substrate and a cell gap compensation pattern between the first base substrate and the second base substrate in the second peripheral area. The cell gap compensation pattern may reduce a difference between a cell gap of the display area adjacent to the first peripheral area and a cell gap of the display area adjacent to the second peripheral area.

According to the above, the cell gap compensation pattern is formed in the peripheral area to minimize the non-uniformity of the cell gap. Thus, the cell gap may be uniformly maintained over the entire display area, thereby improving display quality.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Figure 1:
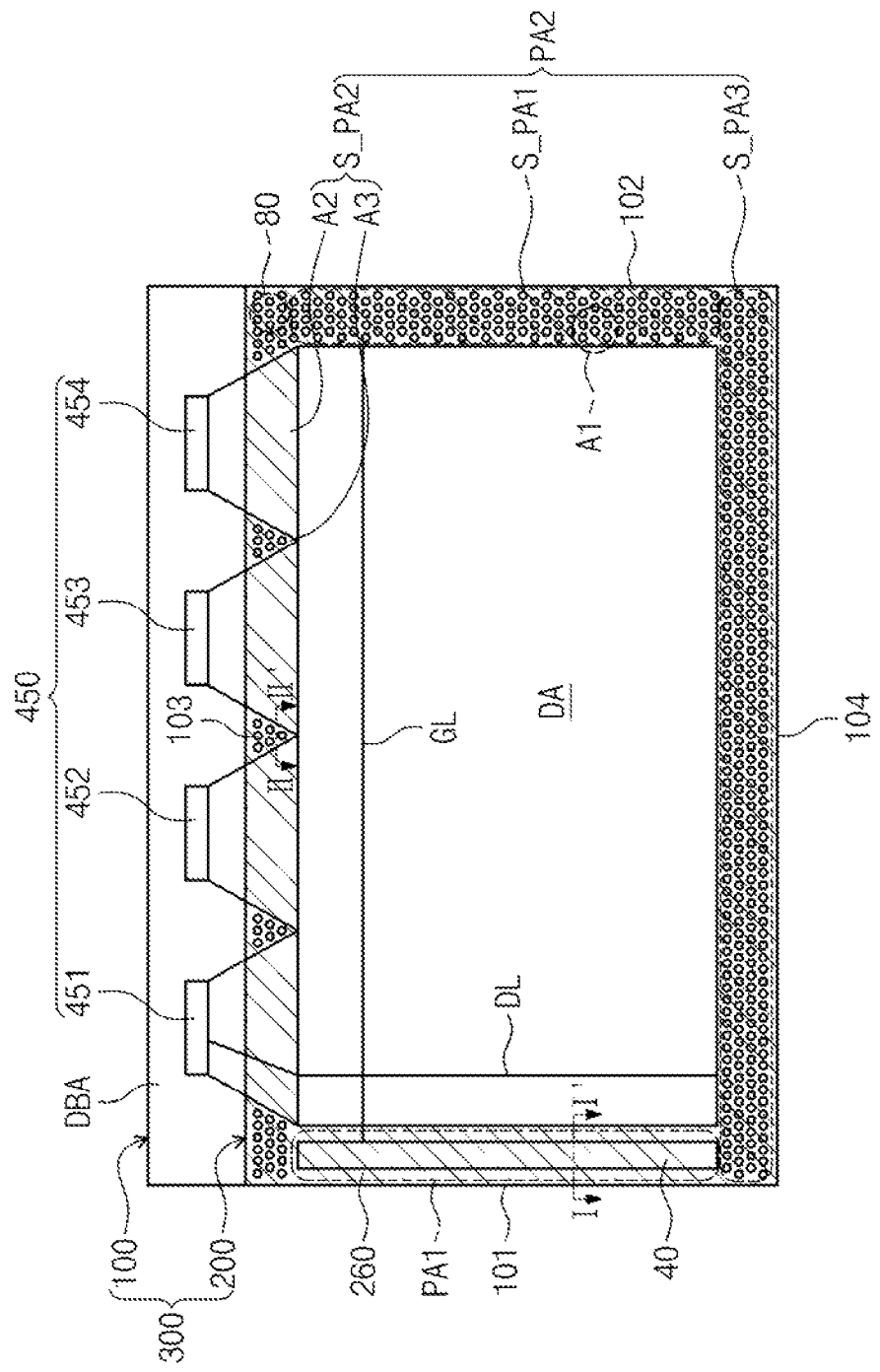
FIG. 1 is a plan view showing a display apparatus according to a first exemplary embodiment of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a plan view showing a display apparatus according to a first exemplary embodiment of the present invention.

Referring to FIG. 1, a display apparatus 300 includes a first substrate 100 and a second substrate 200 facing the first substrate 100. In the first exemplary embodiment, the display apparatus 300 may be a liquid crystal display further including a liquid crystal layer 250 (shown in FIG. 2A and FIG. 4) disposed between the first substrate 100 and the second substrate 200.

The first substrate 100 includes a first base substrate 10 (shown in FIG. 4) which includes a display area DA, a peripheral area PA, and a data bonding area DBA. A first driver 40 is arranged on the first base substrate 10 in the first peripheral area PA1, a second driver 450 is arranged on the first base substrate 10 in the data bonding area DBA, a plurality of gate lines extend from the first driver 40, a plurality of data lines extend from the second driver 450, and a plurality of pixels are arranged on the first base substrate 10 in the display area DA. As shown, the peripheral area PA includes a first peripheral area PA1 and a second peripheral area PA2.

In the exemplary embodiments disclosed herein, all the gate lines have substantially the same structure and all the data lines have substantially the same structure. Hence, for convenience of explanation and to avoid redundancy, one gate line GL and one data line DL will be described in detail.

In the first exemplary embodiment, the display apparatus 300 displays images in the display area DA. The peripheral area PA surrounds the display area DA in plan view, and a coupling member 260 is disposed between the first substrate 100 and the second substrate 200 corresponding to the peripheral area PA to couple the first substrate 100 and the second substrate 200. The coupling member 260 is shown by line-shading in FIG. 1. Conventional sealants can be used as the coupling member 260.

In the first exemplary embodiment, each of the first substrate 100 and the second substrate 200 has a rectangular shape in plan view. The first substrate 100 is bigger than the second substrate 200 such that it extends beyond an edge of the second substrate 200. More particularly, the second substrate 200 has two parallel short sides including a first side 101 and a second side 102 and two long sides including a third side 103 and a fourth side 104, and the first substrate 100 extends beyond the edge of the third side 103 when the fourth side 104 is aligned with an edge of the first substrate 100. In this embodiment, the long sides (103, 104) of the second substrate 200 and the long sides of the first substrate 100 are about the same length. Thus, although the first substrate 100 is coupled with the second substrate 200 by the coupling member 260, the data bonding area DBA of the first substrate 100 is exposed to allow the first substrate 100 to attach to other elements (for example, a flexible printed circuit board (not shown)).

As mentioned above, the peripheral area PA may be divided into the first peripheral area PA1 and the second peripheral area PA2. The first peripheral area PA1 is adjacent to and extends along the edge of the first side 101 in plan view. The second peripheral area PA2 corresponds to an area of the peripheral area PA other than the first peripheral area PA1. The second peripheral area PA2 includes a first sub-peripheral area S_PA1, a second sub-peripheral area S_PA2, and a third sub-peripheral area S_PA3. In plan view, the first sub-peripheral area S_PA1 is adjacent to and extends along the edge of the second side 102, the second sub-peripheral area S_PA2 is adjacent to and extends along the edge of the third side 103, and the third sub-peripheral area S_PA3 is adjacent to and extends along the edge of the fourth side 104.

The first driver 40 is positioned in the first peripheral area PA1 and overlaps the coupling member 260. In addition, the first driver 40 is electrically connected to the gate line GL to apply a driving signal to a pixel PXL (shown in FIG. 3) in the display area DA through the gate line GL in order to drive the pixel PXL.

Figure 3:
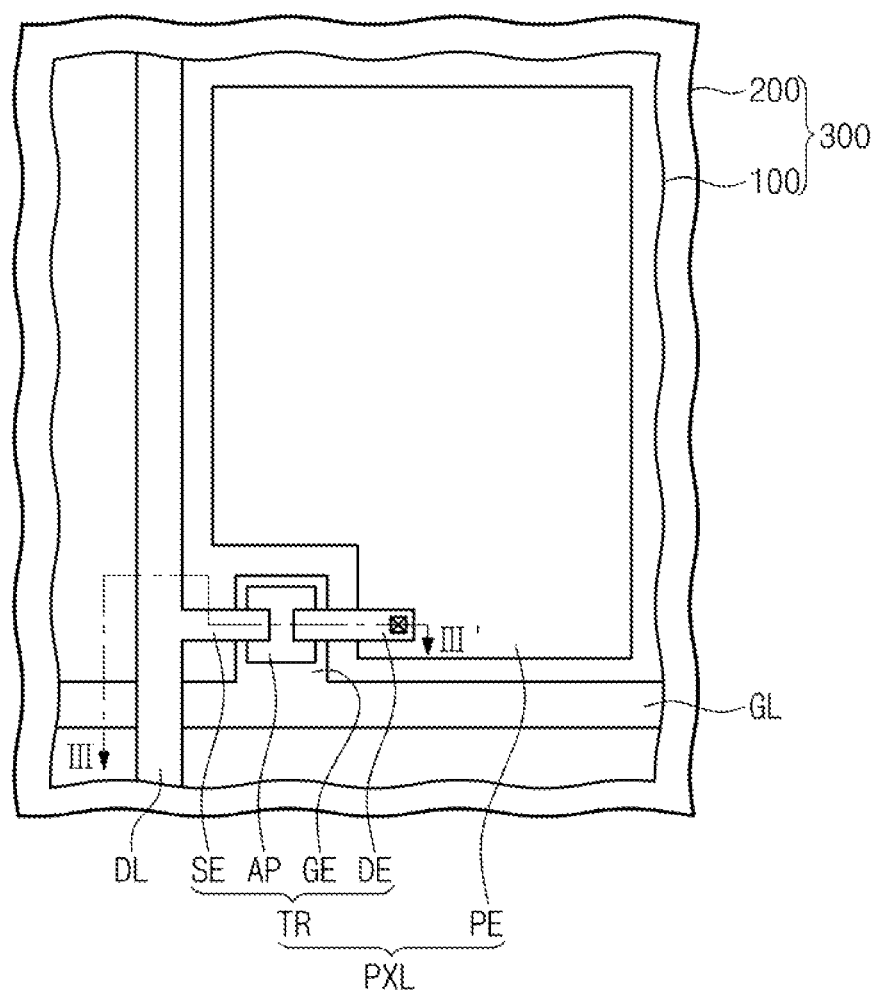
FIG. 3 is a plan view showing a first substrate of FIG. 1.
Figure 4:
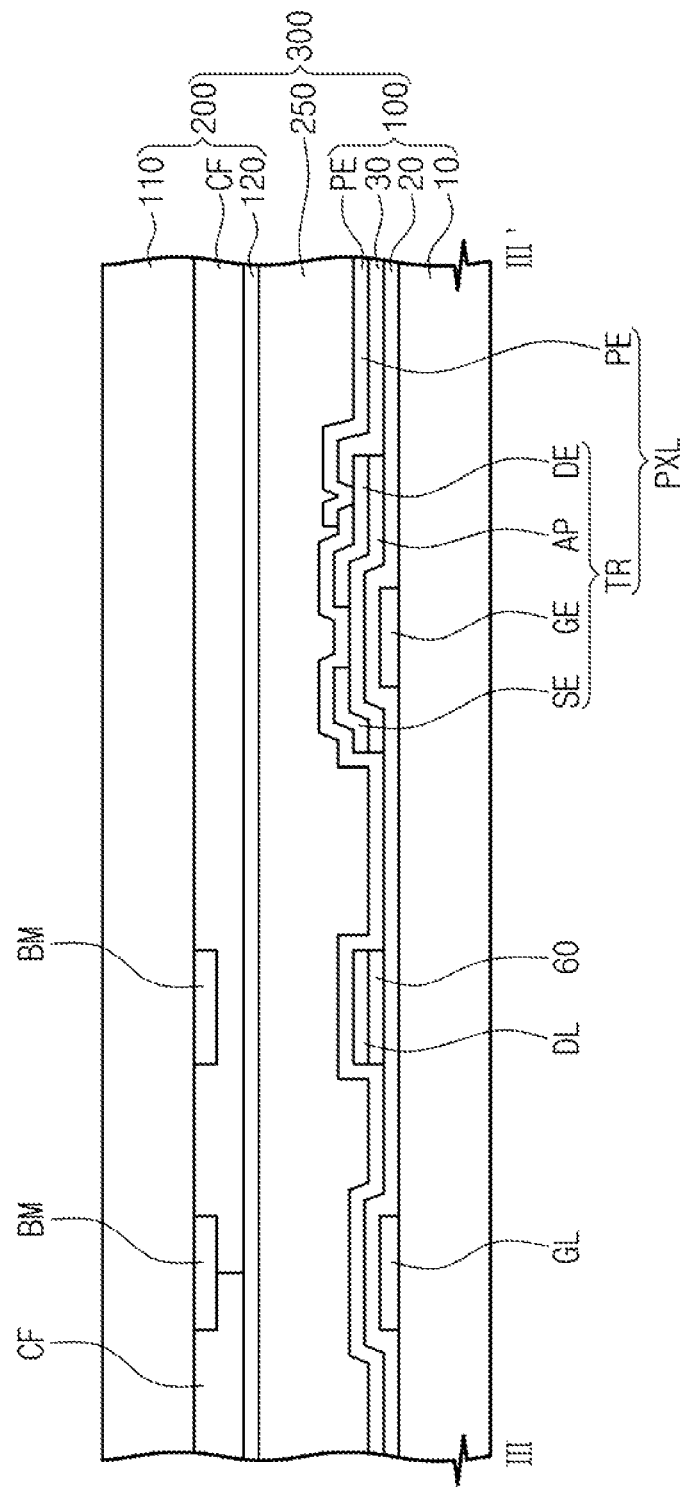
FIG. 4 is a cross-sectional view taken along a line III-III' of FIG. 3.

The second driver 450 is arranged on the data bonding area DBA of the first base substrate 10 (shown in FIG. 4). The second driver 450 is electrically connected to the data line DL and applies a data signal to the pixel PXL (shown in FIG. 3) through the data line DL.

According to the first exemplary embodiment, the second driver 450 includes a first data driving chip 451, a second data driving chip 452, a third data driving chip 453, and a fourth data driving chip 454. However, the number of the data driving chips is not a limitation of the invention. The number of data driving chips included in the second driver 450 may be changed, and the second driver 450 may be a chip-on-film (COF) that is electrically coupled to the first base substrate 10 in the data bonding area DBA.

The second sub-peripheral area S_PA2 includes a fan-out area A2 and a fan-out peripheral area A3. The data line DL extending from the second driver 450 extends into the fan-out area A2, overlapping the coupling member 260 in the fan-out area A2. The fan-out peripheral area A3 is positioned between two adjacent fan-out areas, and the data line DL and the coupling member 260 do not overlap each other in the fan-out peripheral area A3 since the data line DL does not extend into the fan-out peripheral area A3.

The first substrate 100 includes the pixels in the display area DA. The pixels display the images in the display apparatus 300 and each pixel is electrically connected to one of the gate lines and one of the data lines. More detailed descriptions of the structure of the pixels will be described later with reference to FIGS. 3 and 4.

A plurality of cell gap compensation patterns 80 is arranged between the first substrate 100 and the second substrate 200 in the second peripheral area PA2. In detail, the cell gap compensation patterns 80 are arranged between the first substrate 100 and the second substrate 200 in the first sub-peripheral area S_PA1 and the third sub-peripheral area S_PA3. In addition, the cell gap compensation patterns 80 are arranged between the first substrate 100 and the second substrate 200 in the fan-out peripheral area A3 in the second peripheral area PA2. As there are no data lines in the fan-out peripheral area A3, the cell gap compensation patterns 80 do not overlap the data line DL.

As described above, in the first exemplary embodiment, the first driver 40 is arranged in the first peripheral area PA1. The presence of the first driver 40 increases the cell gap in the part of the display area DA that is adjacent to the first peripheral area PA1 due to the thickness of the first driver 40. However, since each of the cell gap compensation patterns 80 can be made with multiple layers of thin films to achieve a desired predetermined total thickness, a cell gap difference between the display area DA adjacent to the first peripheral area PA1 and the display area DA adjacent to the second peripheral area PA2 may be reduced.

Figure 2A:
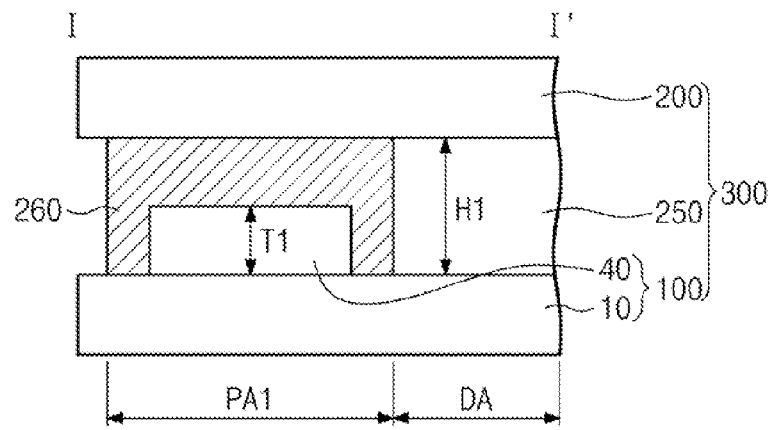
FIG. 2A is a cross-sectional view taken along a line I-I' of FIG. 1.
Figure 2B:
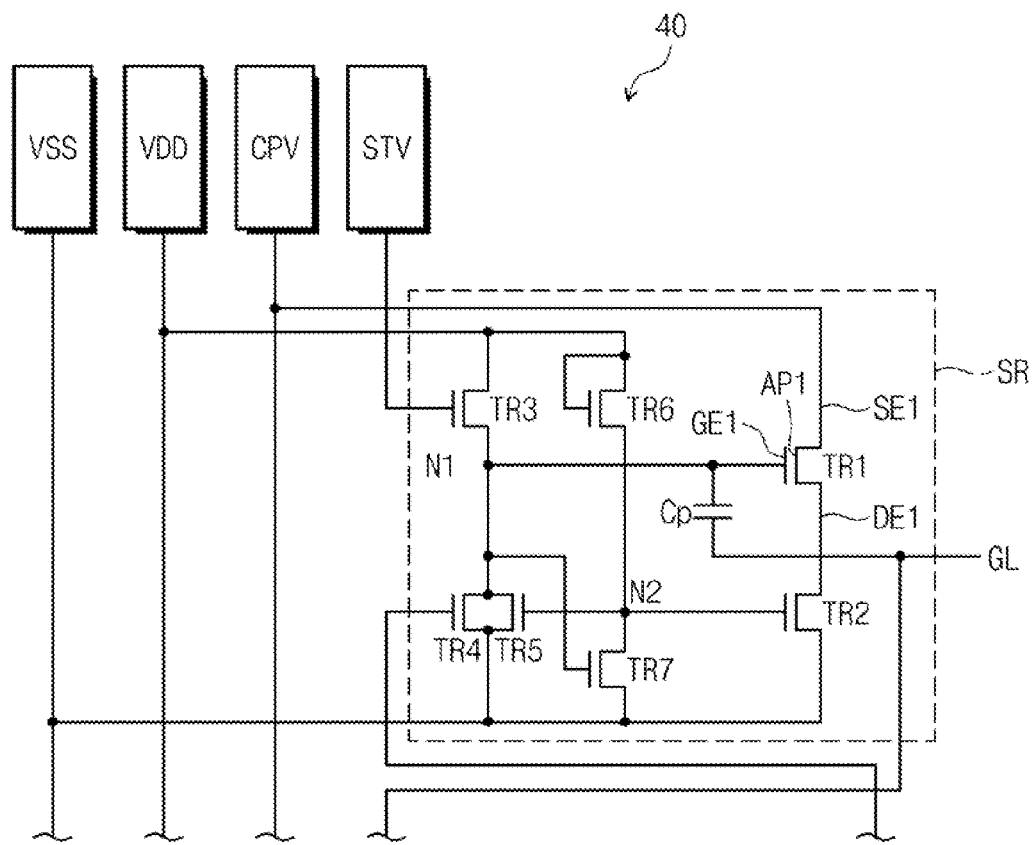
FIG. 2B is a circuit diagram showing a first driver of FIG. 2A.

FIG. 2A is a cross-sectional view taken along a line I-I' of FIG. 1, and FIG. 2B is a circuit diagram showing the first driver of FIG. 2A.

Referring to FIG. 2A, the display apparatus 300 includes the first substrate 100, the second substrate 200, the liquid crystal layer 250 disposed between the first substrate 100 and the second substrate 200 in the display area DA, and the coupling member 260 interposed between the first substrate 100 and the second substrate 200 in the first peripheral area PA1.

The first substrate 100 includes the first base substrate 10 having the first peripheral area PA1 and the display area DA and the first driver 40 arranged in the first peripheral area PA1. The first driver 40 is covered by the coupling member 260 in the first peripheral area PA1.

In the first exemplary embodiment, the first driver 40 may include a shift register including a plurality of stages. Each stage includes thin film transistors (not shown) to generate the driving signal applied to the pixels (not shown) arranged in the display area DA. Each of the thin film transistors includes electrodes having a thin film structure and an active pattern formed to overlap with the electrodes in plan view. That is, since each thin film transistor includes the electrodes and the active pattern disposed on the electrodes, the first driver 40 may have a first thickness T1. A height H1 of the cell gap in the display area DA adjacent to the first peripheral area PA1 may be affected by the first thickness T1 of the first driver 40.

Each one of the stages is connected to one of the gate lines to drive the corresponding gate line GL. Since the stages have the same structure and function, for the convenience of explanation, one stage SR driving one gate line will be illustrated in FIG. 2B.

The stage SR is electrically connected to the gate line GL to apply the driving signal to the pixel PXL (shown in FIG. 3) through the gate line GL. More particularly, the stage SR includes an output buffer having a first thin film transistor TR1 to output a clock CPV to the gate line GL by controlling a first node N1 and a second thin film transistor TR2 to output a low electric potential voltage VSS to the gate line GL by controlling a second node N2. Also, the stage SR includes a controller having a third thin film transistor TR3 to pre-charge the first node N1 with a high electric potential voltage VDD in response to a start pulse STV and fourth to seventh thin film transistors TR4 to TR7.

Where the first to seventh thin film transistors TR1 to TR7 do not overlap each other in plan view, the first thickness T1 of the first driver 40 may be affected by the thickness of the electrode and the active pattern arranged in one thin film transistor of the first to seventh thin film transistors TR1 to TR7. For example, assuming that the first thin film transistor TR1 includes a first gate electrode GE1, a first active pattern AP1 overlapping the first gate electrode GE1, and a first source electrode SE1 and a first drain electrode DE1 spaced apart from each other and overlapping the first active pattern AP1, the first thickness T1 of the first driver 40 may be approximately equal to a sum of the thicknesses of the first gate electrode GE1, the thickness of the first active pattern AP1, the thickness of the first source electrode SE1 or the first drain electrode, a thickness of an insulating layer covering the first gate electrode GE1, and a thickness of an insulating layer covering the first source and drain electrodes SE1 and DE1.

In the first exemplary embodiment, the first to seventh thin film transistors TR1 to TR7 may be formed simultaneously with a thin film transistor TR (shown in FIG. 3) that is arranged in the pixel PXL (shown in FIG. 3). For example, the first gate electrode of the first thin film transistor TR1 and a gate electrode GE (shown in FIG. 3) of the thin film transistor TR (shown in FIG. 3) may be substantially simultaneously formed by patterning a conductive layer formed over an entire surface of the first base substrate 10, and the first source electrode and the first drain electrode of the first thin film transistor TR1 and a source electrode SE (shown in FIG. 3) and a drain electrode DE (shown in FIG. 3) of the thin film transistor TR (shown in FIG. 3) may be substantially simultaneously formed by patterning another conductive layer formed over the entire surface of the first base substrate 10. In addition, the first active pattern of the first thin film transistor TR1 and a semiconductor pattern AP (shown in FIG. 3) of the thin film transistor TR (shown in FIG. 3) may be substantially simultaneously formed by patterning a semiconductor layer formed on the first base substrate 10. Thus, the first gate electrode and the gate electrode GE (shown in FIG. 3) may have the same thickness, and the first source electrode, the first drain electrode, the source electrode SE (shown in FIG. 3), and the drain electrode DE (shown in FIG. 3) may have the same thickness.

FIG. 3 is a plan view showing the first substrate of FIG. 1, and FIG. 4 is a cross-sectional view taken along a line III-III' of FIG. 3. In FIGS. 3 and 4, the first substrate 100 includes the pixels, however, since the pixels have the same structure and function, only one pixel PXL will be described in detail.

Referring to FIGS. 3 and 4, the display apparatus 300 includes the first substrate 100, the second substrate 200, and the liquid crystal layer 250 disposed between the first substrate 100 and the second substrate 200.

The first substrate 100 includes the first base substrate 10, and the gate line GL and the data line DL crossing the gate line GL on the first base substrate 10. A gate insulating layer 20 is disposed between the gate line GL and the data line DL so that the gate line GL may be insulated from the data line DL.

Also, the pixel PXL that is electrically connected to the gate line GL and the data line DL is arranged on the first base substrate 10. The pixel PXL includes the thin film transistor TR and a pixel electrode PE electrically connected to the thin film transistor TR.

The thin film transistor TR includes the gate electrode GE branching from the gate line GL, the semiconductor pattern AP arranged on the gate electrode GE, the source electrode SE branching from the data line DL and arranged on the semiconductor pattern AP, and the drain electrode DE spaced apart from the source electrode SE and arranged on the semiconductor pattern AP. An insulating layer 30 is disposed on the first base substrate 10 to cover the thin film transistor TR. Also, the insulating layer 30 is partially removed to expose a portion of the drain electrode DE, and the pixel electrode PE is arranged on the insulating layer 30 and is electrically connected to the drain electrode DE through the portion from which the insulating layer 30 is removed.

In the thin film transistor TR having the above described structure, the thin film transistor TR is turned on in response to the driving signal generated from the first driver 40 (shown in FIG. 1) and applied through the gate line GL and the gate electrode GE. When the thin film transistor TR is turned on, the data signal generated from the second driver 450 (shown in FIG. 1) is applied to the pixel electrode PE through the data line DL, the semiconductor pattern AP, and the drain electrode DE.

The second substrate 200 includes the second base substrate 110, a color filter CF, a black matrix BM, and a common electrode 120.

The black matrix BM overlaps the gate line GL and the data line DL in plan view to block light that is transmitted through the first substrate 100 and the liquid crystal layer 250 corresponding to areas in which the gate line GL and the data line DL are formed. The color filter CF is arranged on the second base substrate 200 to filter the light that is transmitted through the first substrate 100 and the liquid crystal layer 250 to a predetermined color. The common electrode 120 is arranged on the color filter CF to form an electric field with the pixel electrode PE to control an alignment direction of liquid crystal molecules of the liquid crystal layer 250.

In the first exemplary embodiment, the color filter CF is arranged on the second base substrate 110 but the color filter CF may be arranged on the first base substrate 10. In addition, the common electrode 120 is arranged on the second base substrate 110; however, the common electrode 120 may be arranged on the first base substrate 10 to be spaced apart from the pixel electrode PE.

In the alternative embodiment, since the gate electrode GE branches from the gate line GL, the gate electrode GE may have the same thickness as the gate line GL. Similarly, since the source electrode SE branches from the data line DL, the source electrode SE may have the same thickness as the data line DL. The drain electrode DE may have the same thickness as the source electrode SE.

In addition, in the alternative embodiment, a dummy semiconductor layer 60 having the same shape as the data line DL is arranged between the data line DL and the gate insulating layer 20. The dummy semiconductor layer 60 is arranged under the data line DL according to characteristics of the method of manufacturing the first substrate 100. In more detail, the conductive layer (not shown) and the semiconductor layer (not shown) are sequentially formed on the first base substrate 10 in order to form the data line DL and the semiconductor pattern AP. Then, the conductive layer and the semiconductor layer are substantially simultaneously patterned by a photolithography process using a photomask. As a result, the dummy semiconductor layer 60 is formed under the data line DL to have the same shape as the data line DL in a plan view.

Figure 5A:
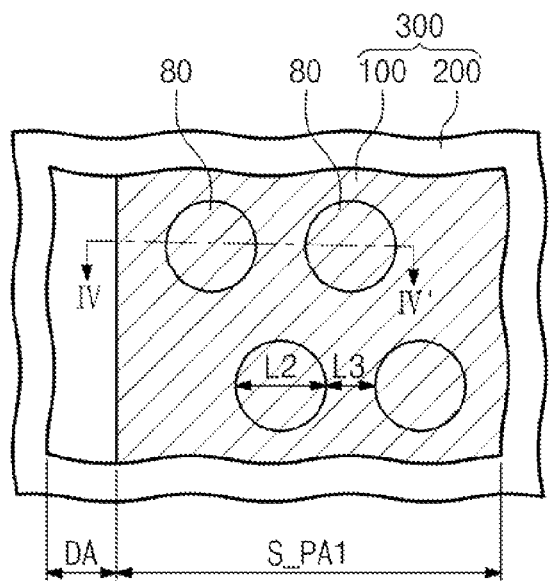
FIG. 5A is an enlarged plan view showing a border area between a first sub-peripheral area and a display area of a display apparatus of FIG. 1.
Figure 5B:
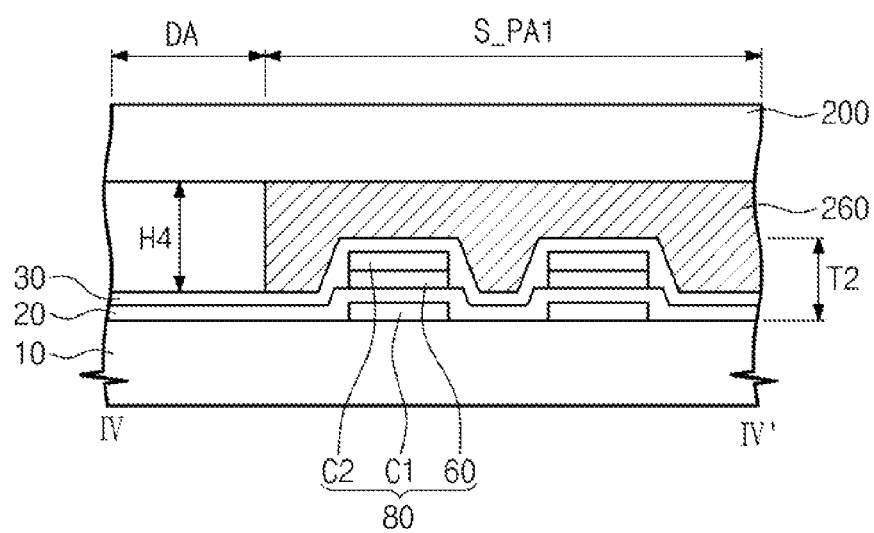
FIG. 5B is a cross-sectional view taken along a line IV-IV' of FIG. 5A.

FIG. 5A is an enlarged plan view showing a border area between the first sub-peripheral area S_PA1 and the display area DA of the display apparatus of FIG. 1, and more particularly, FIG. 5A is an enlarged plan view showing a first area A1 of FIG. 1. FIG. 5B is a cross-sectional view taken along a line IV-IV' of FIG. 5A. Since the cell gap compensation patterns 80 have the same structure and function, for the convenience of explanation, only one cell gap compensation pattern will be described in detail.

Referring to FIGS. 5A and 5B, the cell gap compensation pattern 80 is arranged on the first base substrate 10. In the first exemplary embodiment, the cell gap compensation pattern 80 may have a round shape with a diameter L2 of about 10 micrometers in a plan view, and a distance L3 between two adjacent cell gap compensation patterns arranged in a same row may be smaller than the diameter L2. However, the shape or size of the cell gap compensation pattern 80 is not limited to what is disclosed. For example, the cell gap compensation pattern 80 may have various shapes, such as a polygonal shape or an oval shape rather than the round shape.

The cell gap compensation pattern 80 includes a first conductive layer C1, the dummy semiconductor layer 60, and a second conductive layer C2. The first conductive layer C1 is arranged on the first base substrate 10, the dummy semiconductor layer 60 is arranged on the first conductive layer C1 with the gate insulating layer 20 between them, and the second conductive layer C2 is arranged on the dummy semiconductor layer 60.

Referring again to FIGS. 3 and 4, the first conductive layer C1 includes the same material as the gate line GL and the gate electrode GE and has the same thickness as the gate line GL and the gate electrode GE. The second conductive layer C2 includes the same material as the data line DL, the source electrode SE, and the drain electrode DE and has the same thickness as the data line DL, the source electrode SE, and the drain electrode DE. The dummy semiconductor layer 60 has the same material as the semiconductor pattern AP and has the same thickness as the semiconductor pattern AP.

Thus, since the thickness of the first driver 40 (shown in FIG. 2A) is equal to the sum of the thicknesses of the gate electrode GE, the source electrode SE or the drain electrode DE, the semiconductor pattern AP, and the insulating layers 20 and 30 (as described above), the cell gap compensation pattern 80 may have a thickness T2 the same as that of the first driver 40. Consequently, a difference between a height H4 of a cell gap in the display area DA adjacent to the first sub-peripheral area S_PA1 and the height H1 of the cell gap in the display area DA adjacent to the first peripheral area PA1 (shown in FIG. 2A) may be minimized by the thickness T2 of the cell gap compensation pattern 80.

Meanwhile, although the cell gap compensation patterns arranged in the third sub-peripheral area S_PA3 (shown in FIG. 1) are not shown separately, in the first exemplary embodiment, the structure of the cell gap compensation patterns arranged in the third sub-peripheral area S_PA3 may be the same as that of the cell gap compensation patterns arranged in the first sub-peripheral area S_PA1 (shown in FIG. 1).

Figure 6:
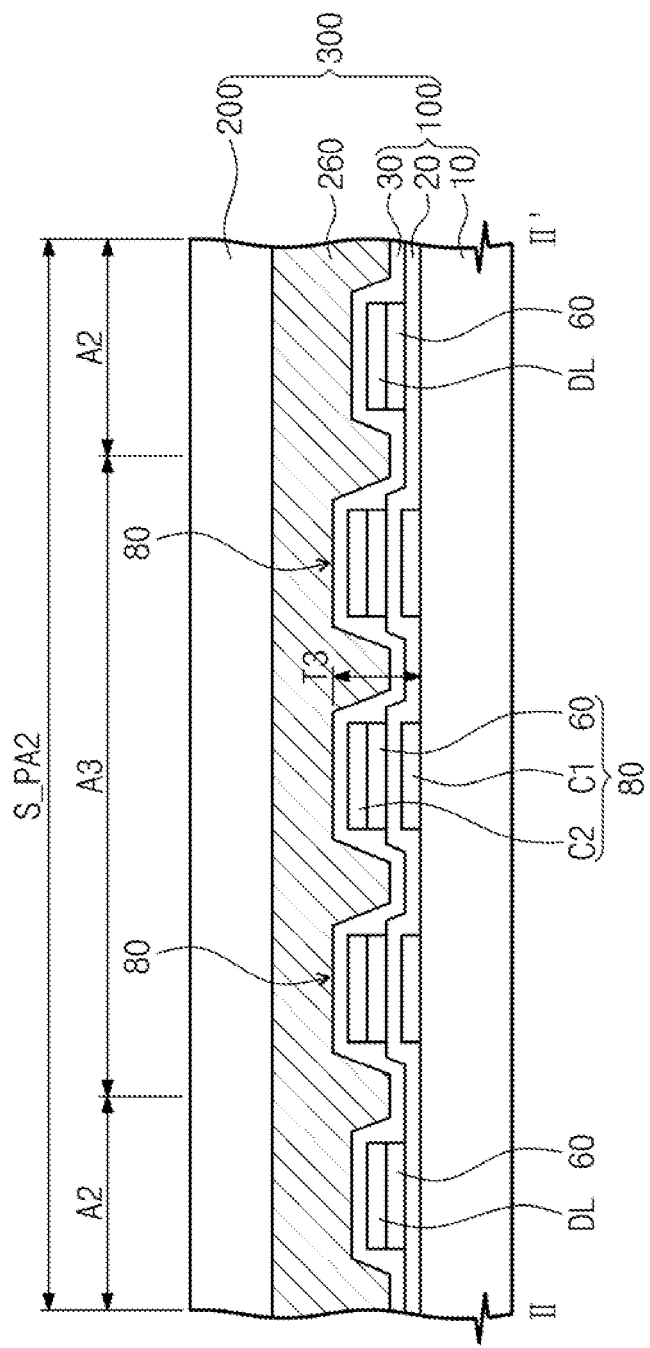
FIG. 6 is a cross-sectional view taken along a line II-II' of FIG. 1.

FIG. 6 is a cross-sectional view taken along a line II-II' of FIG. 1.

Referring to FIG. 6, the first base substrate 10 includes the second sub-peripheral area S_PA2. As described with reference to FIG. 1, the second sub-peripheral area S_PA2 may be divided into the fan-out area A2 and the fan-out peripheral area A3.

The data line DL is arranged on the first base substrate 10 corresponding to the fan-out area A2, and the cell gap compensation pattern 80 is arranged on the first base substrate 10 corresponding to the fan-out peripheral area A3. In the embodiment shown, data line DL does not extend into the fan-out peripheral area A3 and the cell gap compensation pattern 80 is not formed in the fan-out area A2. However, this may not be the case in some alternative embodiments and obvious modifications may be made as long as the cell gap across the display area DA substantially constant.

As described above with reference to FIGS. 5A and 5B, since the cell gap compensation pattern 80 has the structure in which the first conductive layer C1, the gate insulating layer 20, the dummy semiconductor layer 60, the second conductive layer C2, and the insulating layer 30 are sequentially layered on one another, a thickness T3 of the cell gap compensation pattern 80 arranged in the fan-out peripheral area A3 is substantially the same as each of the thickness T2 of the cell gap compensation pattern 80 (shown in FIG. 5B) arranged in the first sub-peripheral area S_PA1 (shown in FIG. 5B) and the thickness of the cell gap compensation pattern arranged in the third sub-peripheral area S_PA3 (shown in FIG. 1).

Therefore, referring again to FIG. 1, the height of the cell gap of the display area DA adjacent to the fan-out peripheral area A3 may be the substantially same as the height of the cell gap of the display area DA adjacent to the first peripheral area PA1. As a result, the height of the cell gap of the display area DA adjacent to the first peripheral area PA1, the height of the cell gap of the display area DA adjacent to the fan-out peripheral area A3, the height of the cell gap of the display area DA adjacent to the first sub-peripheral area S_PA1, and the height of the cell gap of the display area DA adjacent to the third sub-peripheral area S_PA3 may be substantially constant.

Figure 7A:
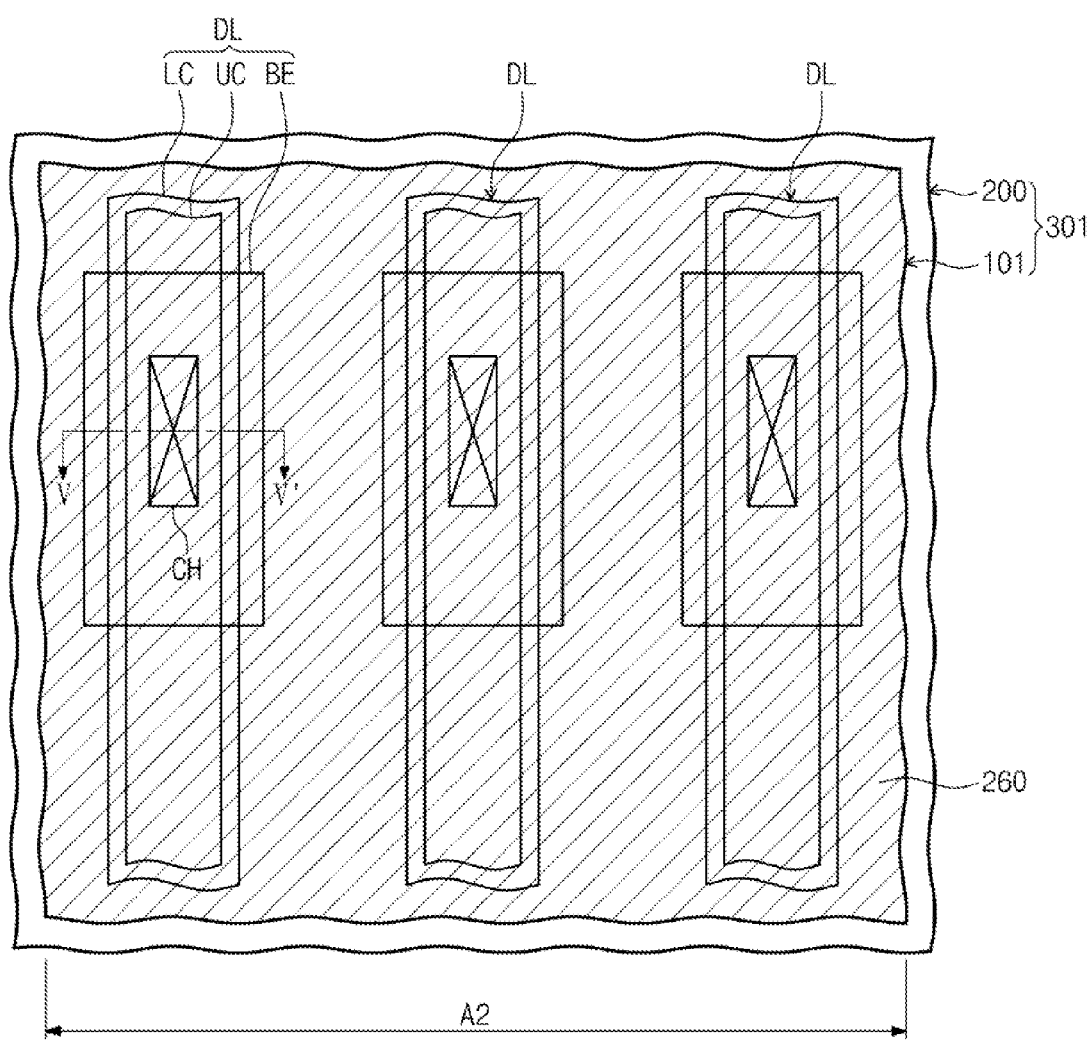
FIG. 7A is a plan view showing a display apparatus according to a second exemplary embodiment of the present invention.
Figure 7B:
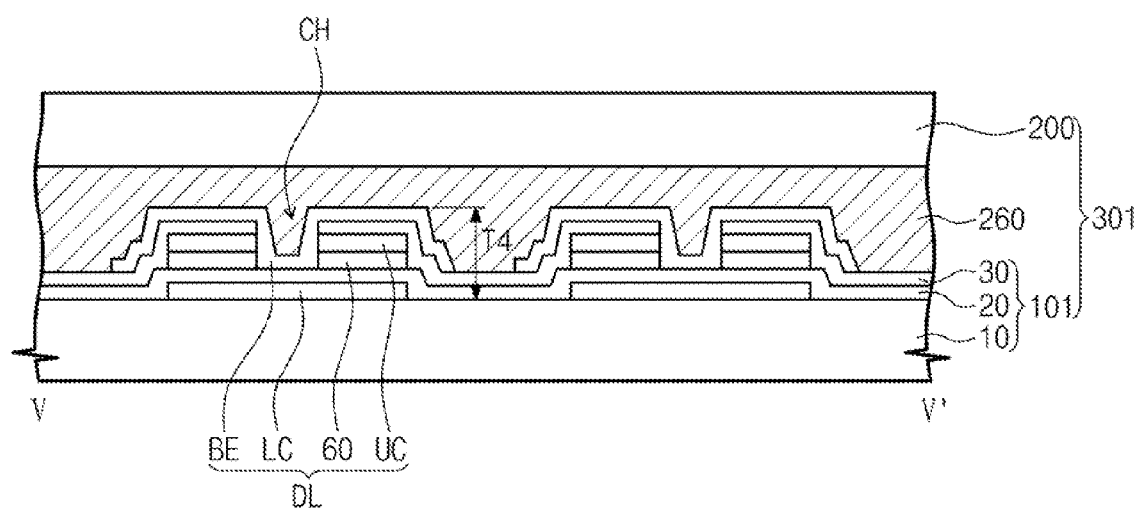
FIG. 7B is a cross-sectional view taken along a line V-V' of FIG. 7A.

FIG. 7A is a plan view showing a display apparatus according to a second exemplary embodiment of the present invention, and FIG. 7B is a cross-sectional view taken along a line V-V' of FIG. 7A.

In the second exemplary embodiment of the present invention, a display apparatus 301 has substantially the same structure as the display apparatus 300 (shown in FIG. 1) according to the first exemplary embodiment. Hence, detailed descriptions of the display apparatus 301 will be omitted. In addition, in FIGS. 7A and 7B, the same reference numerals denote the same elements as in FIGS. 1 to 6.

Referring to FIGS. 7A and 7B, a plurality of data lines DL spaced apart from each other is arranged on a first base substrate 10 in a fan-out area A2. Since the data lines have the same structure and function, for the convenience of explanation, only one data line will be described in detail.

The data line DL includes a lower conductive layer LC and an upper conductive layer UC arranged on the lower conductive layer UC to sandwich a gate insulating layer 20 therebetween, and a connection electrode BE that electrically connects the lower conductive layer LC to the upper conductive layer UC through a contact hole CH formed through an insulating layer 30. In the second exemplary embodiment, the data line DL further includes a dummy semiconductor layer 60 disposed between the upper conductive layer UC and the gate insulating layer 20 as described above with reference to FIGS. 3 and 4.

The connection electrode BE is electrically connected to the lower conductive layer LC through the contact hole CH that is formed by partially removing the upper conductive layer UC and the gate insulating layer 20, and as a result, the upper conductive layer UC and the lower conductive layer LC may be electrically connected to each other by the connection electrode BE.

Meanwhile, in the second exemplary embodiment, the upper conductive layer UC has a contact hole CH. Although the contact hole CH is shown as having a rectangular shape in plan view, this is just an example and the opening (contact hole) may have any suitable shape such as a circle, an oval, and a polygon. In addition, there may be more than one opening for each data line DL.

In addition, in the second exemplary embodiment, the lower conductive layer LC may be formed through a photolithography process using the same photomask as the first conductive layer C1 (shown in FIG. 5B) to have the same thickness as the first conductive layer C1. Similarly, the upper conductive layer UC may be formed through the same process as the second conductive layer C2 (shown in FIG. 5B) to have the same thickness as the second conductive layer C2. Accordingly, since a thickness T4 of the data line DL arranged in the fan-out area A2 may be substantially the same as the thickness T2 of the cell gap compensation pattern 80 (shown in FIG. 5B) when disregarding the thickness of the connection electrode BE, the thickness T4 of the data line DL may be substantially the same as the thickness T1 of the first driver 40 (shown in FIG. 2A). Consequently, a difference between the cell gap of the display area DA (shown in FIG. 1) adjacent to the fan-out area A2 and the cell gap H1 (shown in FIG. 2A) of the display area DA adjacent to the first driver 40 may be minimized.

Further, the data line DL includes the upper conductive layer UC and the lower conductive layer LC electrically connected to the upper conductive layer UC by the connection electrode BE, so that an electric resistance of the data line DL is reduced.

Figure 8A:
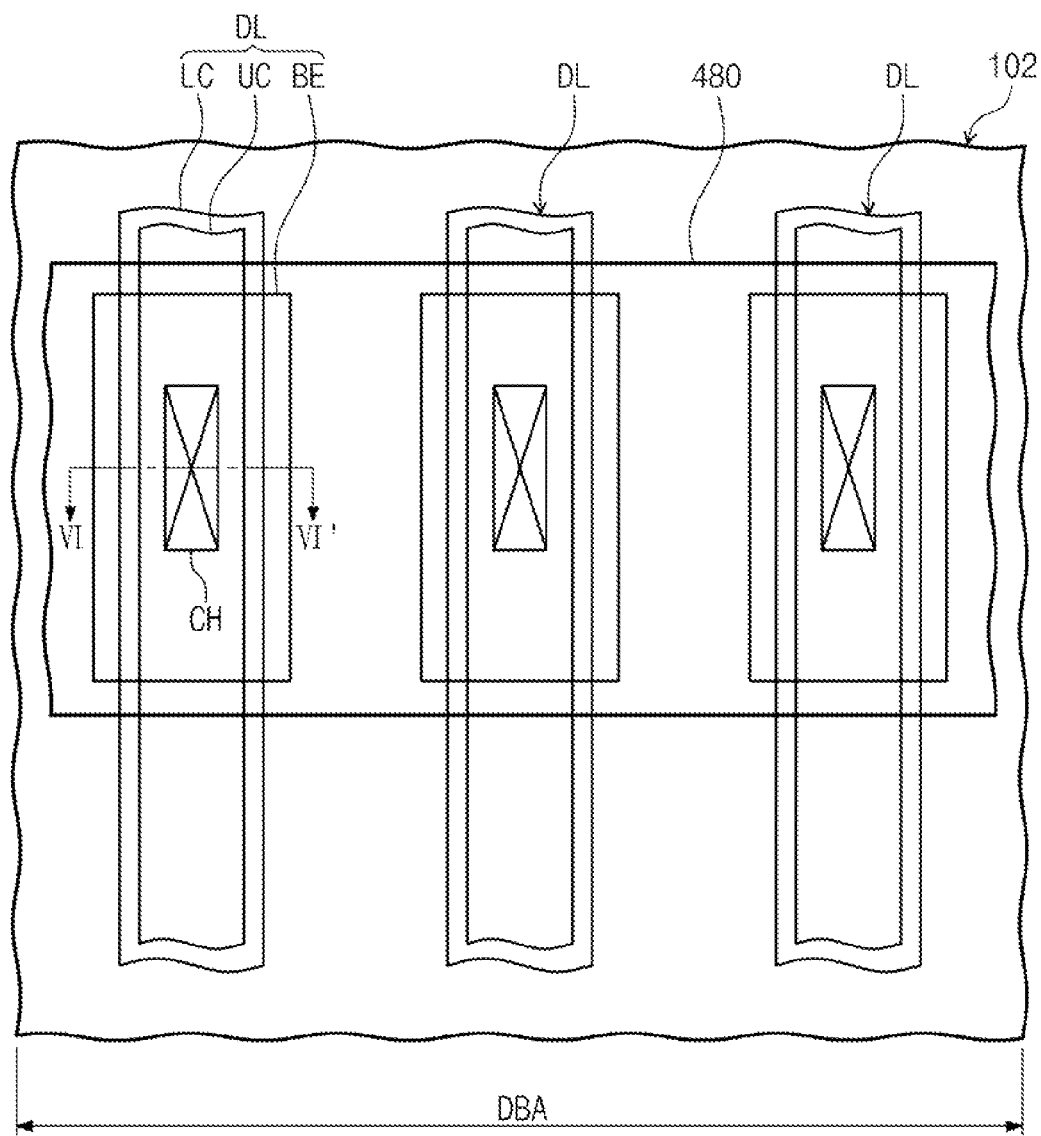
FIG. 8A is a plan view showing a display apparatus according to a third exemplary embodiment of the present invention.
Figure 8B:
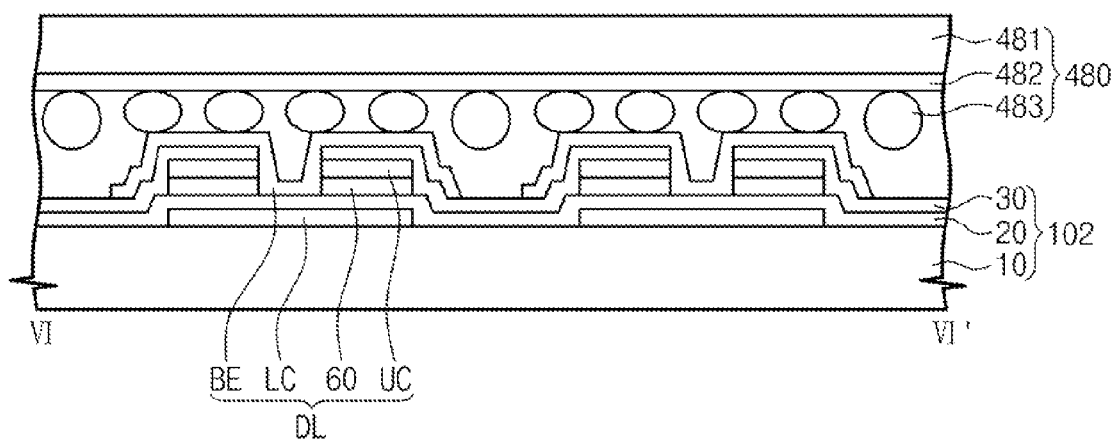
FIG. 8B is a cross-sectional view taken along a line VI-VI' of FIG. 8A.

FIG. 8A is a plan view showing a display apparatus according to a third exemplary embodiment of the present invention. More particularly, FIG. 8A is a plan view showing a data bonding area of a display apparatus according to a third exemplary embodiment of the present invention. FIG. 8B is a cross-sectional view taken along a line VI-VI' of FIG. 8A. Similarly to the display apparatus 300 (shown in FIG. 1) according to the first exemplary embodiment, a display apparatus according to the third exemplary embodiment has a structure in which a first substrate 102 is has a data bonding area DBA that is not covered by a second substrate 200, and thus a second substrate facing the first substrate 102 will not be illustrated in FIGS. 8A and 8B.

In FIGS. 8A and 8B, the same reference numerals denote the same elements in FIGS. 1 to 6, and thus the detailed descriptions of the same elements will be omitted.

Referring to FIGS. 8A and 8B, a first substrate 102 includes a first base substrate 10 having a data bonding area DBA and a plurality of data lines DL arranged on the first base substrate 10 and spaced apart from each other. Since the data lines DL have the same structure and function, for the convenience of explanation, only one data line will be described as a representative example.

The data line DL includes a lower conductive layer LC, an upper conductive layer UC disposed on the lower conductive layer LC while sandwiching a gate insulating layer 20 therebetween, and a connection electrode BE that electrically connects the lower conductive layer LC and the upper conductive layer UC through a contact hole CH formed through an insulating layer 30.

The connection electrode BE is electrically connected to the lower conductive layer LC through the contact hole CH that is formed by removing a portion of the upper conductive layer UC and a portion of the gate insulating layer 20. As a result, the upper conductive layer UC and the lower conductive layer LC may be electrically connected to each other by the connection electrode BE.

In addition, the data line DL is electrically connected to a second driver 480. According to the first exemplary embodiment, the second driver 450 (shown in FIG. 1) is implemented in the form of a chip. However, the second driver 480 according to the third exemplary embodiment is implemented as a layer or a film. The second driver 480 includes a base film 481 and a terminal part 482 arranged on a surface of the base film 481, and a plurality of conductive balls 483 are disposed between the data line DL and the terminal part 482. The conductive balls 483 are electrically connected to the connection electrode BE and the terminal part 482, so that the data driver 480 may be electrically connected to the data line DL through the conductive balls 483.

Figure 9:
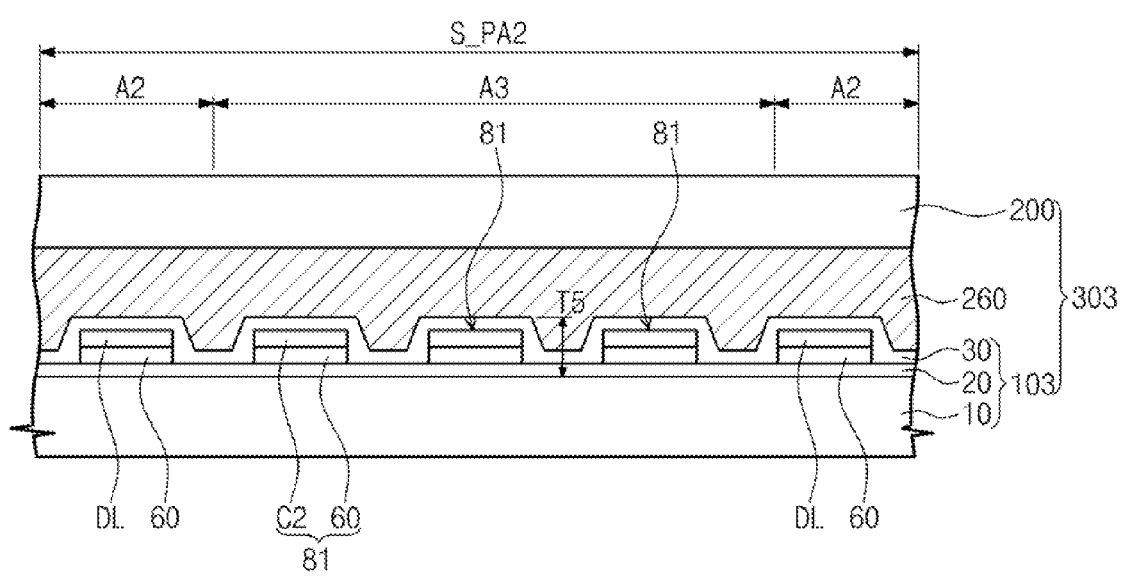
FIG. 9 is a cross-sectional view showing a display apparatus according to a fourth exemplary embodiment of the present invention.

FIG. 9 is a cross-sectional view showing a display apparatus according to a fourth exemplary embodiment of the present invention. More particularly, FIG. 9 is a cross-sectional view showing a display apparatus corresponding to a second sub-peripheral area according to a fourth exemplary embodiment of the present invention. In FIG. 9, the same reference numerals denote the same elements as in FIGS. 1 to 6, and thus the detailed descriptions of the same elements will be omitted.

Referring to FIG. 9, a display apparatus 303 includes a first substrate 103 and a second substrate 200, and the first substrate 103 includes a second sub-peripheral area S_PA2 that is divided into a fan-out area A2 and a fan-out peripheral area A3.

A cell gap compensation pattern 81 is arranged on a first base substrate 10 corresponding to the fan-out peripheral area A3. The call gap compensation pattern 81 includes a second conductive layer C2, a dummy semiconductor pattern 60, and the insulating layers 20 and 30 to have a fifth thickness T5.

Unlike the cell gap compensation pattern 81 (shown in FIG. 9), the cell gap compensation pattern 80 (shown in FIG. 6) further includes the first conductive layer C1 (shown in FIG. 6). Therefore, the thickness T5 of the cell gap compensation pattern 81 (shown in FIG. 9) may be smaller than the thickness T3 of the cell gap compensation pattern 80 (shown in FIG. 6). However, since the thickness T5 of the cell gap compensation pattern 81 is equal to a thickness of a structure including a data line DL and a dummy semiconductor layer 60 arranged in the fan-out area A2, the cell gap of a display area DA (shown in FIG. 1) adjacent to the second sub-peripheral area S_PA2 may be uniformly maintained.

Figure 10:
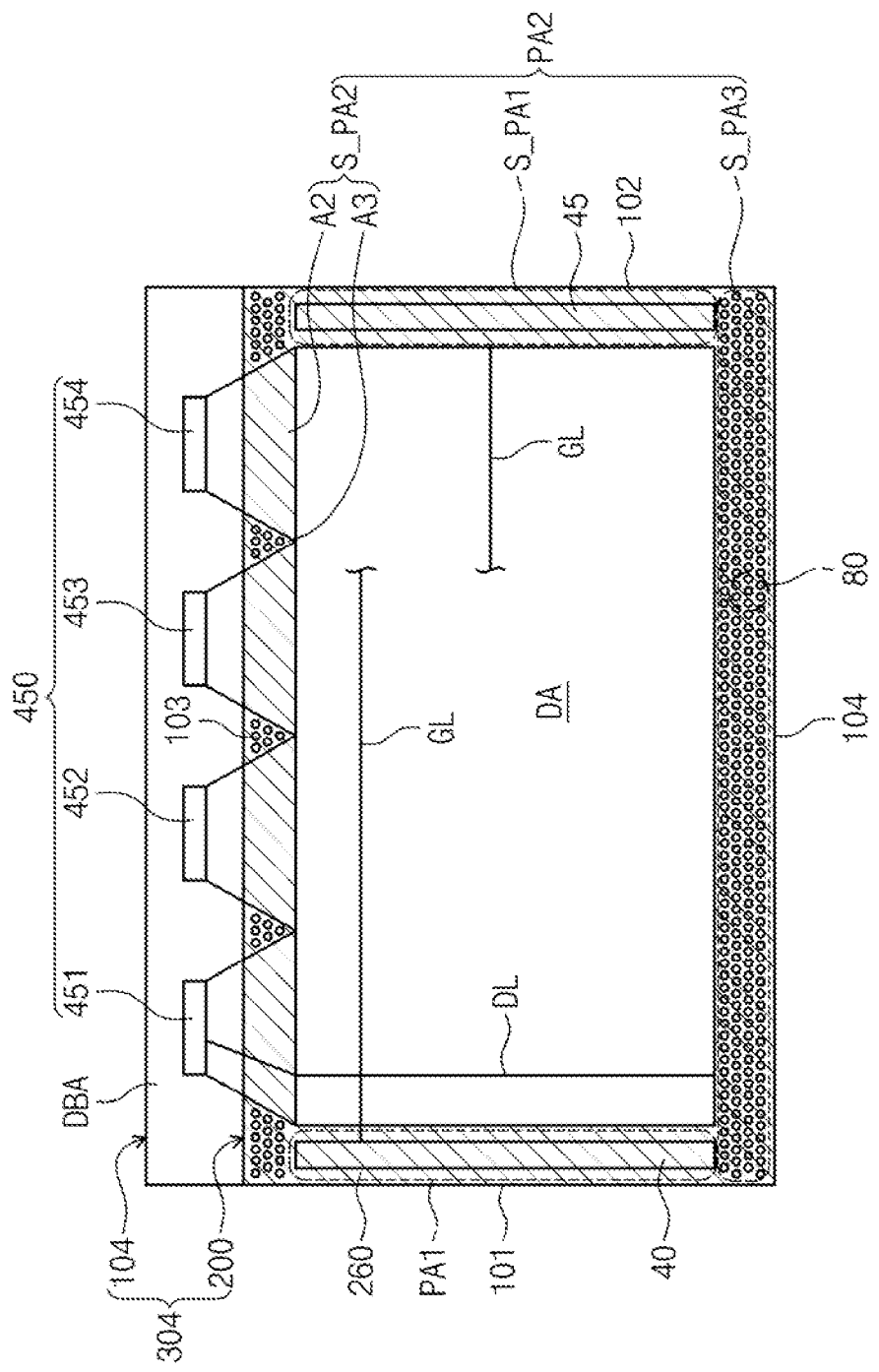
FIG. 10 is a plan view showing a display apparatus according to a fifth exemplary embodiment of the present invention.

FIG. 10 is a plan view showing a display apparatus according to a fifth exemplary embodiment of the present invention. In FIG. 10, the same reference numerals denote the same elements in FIG. 1 according to the first exemplary embodiment, and thus the detailed descriptions of the same elements will be omitted.

Referring to FIG. 10, a display apparatus 304 includes a first substrate 104, a second substrate 200, and a liquid crystal layer (not shown) disposed between the first substrate 104 and the second substrate 200.

Referring again to FIG. 1, the display apparatus 300 includes one first driver 40, and the first driver 40 is positioned in the first peripheral area PA1. In addition, the display apparatus 304 according to the fifth exemplary embodiment includes a first sub-driver 45 positioned in a first sub-peripheral area S_PA1 across the display area DA from the first peripheral area PA1.

Since the first sub-driver 45 has the same structure and function as the first driver 40 described with reference to FIGS. 2A and 2B, the first sub-driver 45 may have the same thickness as the first driver 40. The first sub-driver 45 is electrically connected to a gate line GL to apply a driving signal to the pixel PXL (shown in FIG. 3) arranged in a display area DA through the gate line GL.

As described above, since the display apparatus 304 includes the first driver 40 and the first sub-driver 45, a position of cell gap compensation patterns 80 may be different from the position of the cell gap compensation patterns in the first exemplary embodiment. More particularly, in the fifth exemplary embodiment, the cell gap compensation patterns 80 are arranged in a fan-out peripheral area A3 of a second sub-peripheral area S_PA2 and a third sub-peripheral area S_PA3.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display apparatus comprising:
a first base substrate comprising a display area, a peripheral area adjacent to the display area, and a data bonding area, the peripheral area including a first peripheral area and a second peripheral area;
a second base substrate coupled to the first base substrate;
a pixel arranged in the display area;
a first driver arranged in the first peripheral area and configured to apply a driving signal to the pixel through a gate line;
a second driver arranged in the data bonding area of the first base substrate and configured to apply a data signal to the pixel through a data line;
a cell gap compensation pattern arranged between the first base substrate and the second base substrate; and
a coupling member disposed between the first base substrate and the second base substrate in the peripheral area to cover the first driver and the cell gap compensation pattern and couple the first base substrate to the second base substrate,
wherein the second peripheral area includes fan-out areas and fan-out peripheral areas, and each of the fan-out peripheral areas is arranged between two adjacent fan-out areas among the fan-out areas,
wherein the data line is arranged on the first base substrate extending from the second driver to the pixel across the fan-out areas, and electrically connected to the second driver to apply the data signal to the pixel, and
wherein the cell gap compensation pattern is disposed in the second peripheral area except the fan-out areas without overlapping the gate line and the data line.

2. The display apparatus of claim 1, wherein a height difference between a first cell gap of the display area adjacent to the first peripheral area and a second cell gap of the display area adjacent to the second peripheral area is reduced by the cell gap compensation pattern.

3. The display apparatus of claim 2, wherein the gate line is arranged on the first base substrate and electrically connected to the first driver to apply the driving signal to the pixel, and wherein the cell gap compensation pattern comprises a first conductive layer and a second conductive layer.

4. The display apparatus of claim 3, wherein the first conductive layer and the gate line contain a first material and the second conductive layer and the data line contain a second material.

5. The display apparatus of claim 3, wherein the second peripheral area comprises:
a first sub-peripheral area across the display area from the first peripheral area;
a second sub-peripheral area positioned between the first peripheral area and the first sub-peripheral area and between the display area and the second driver; and
a third sub-peripheral area across the display area from the second sub-peripheral area, wherein the cell gap compensation pattern includes the first and second conductive layers in each of the first and third sub-peripheral areas, and the cell gap compensation pattern includes the second conductive layer formed in the second sub-peripheral area without overlapping the data line.

6. The display apparatus of claim 5, wherein the cell gap compensation pattern further comprises the first conductive layer in the second sub-peripheral area.

7. The display apparatus of claim 6, wherein the pixel comprises:
a thin film transistor configured to be turned on in response to the driving signal; and a pixel electrode electrically connected to the thin film transistor,
wherein the thin film transistor comprises:
a gate electrode branching from the gate line;
a semiconductor pattern overlapping the gate electrode;
a source electrode branching from the data line and overlapping the semiconductor pattern; and
a drain electrode spaced apart from the source electrode and overlapping the semiconductor pattern, wherein the first driver comprises at least one thin film transistor including at least one electrode having a same thickness as the gate line, at least one electrode having a same thickness as the data line, and an active pattern having a same thickness as the semiconductor pattern.

8. The display apparatus of claim 7, further comprising a dummy semiconductor layer having a same thickness as the semiconductor pattern, wherein the dummy semiconductor layer is arranged under the data line and the second conductive layer.

9. The display apparatus of claim 5, wherein the data line comprises:
a lower conductive layer comprising a same material as the gate line;
an upper conductive layer comprising a same material as the data line, the upper conductive layer disposed on the lower conductive layer and an insulating layer; and
a connection electrode electrically connecting the upper conductive layer to the lower conductive layer through an opening formed in the upper conductive layer and the insulating layer.

10. The display apparatus of claim 9, wherein the connection electrode is positioned in the second sub-peripheral area and overlaps the coupling member in a plan view.

11. The display apparatus of claim 9, wherein the data bonding area is spaced apart from the display area by the second sub-peripheral area; and
wherein the second driver is electrically connected to the data line in the data bonding area to apply the data signal to the data line, and wherein the connection electrode is positioned in the data bonding area.

12. The display apparatus of claim 3, wherein the first base substrate comprises a first sub-peripheral area across the display area from the first peripheral area, wherein a first sub-driver is arranged in the first sub-peripheral area.

13. The display apparatus of claim 12, wherein the second peripheral area is divided into a first sub-peripheral area and a third sub-peripheral area that is across the display area from the second sub-peripheral area, the data line extends to the display area from the second sub-peripheral area, the cell gap compensation pattern comprises the second conductive layer in a part of the second sub-peripheral area that does not overlap the data line, and the cell gap compensation pattern includes the first and second conductive layers in the third sub-peripheral area.

14. The display apparatus of claim 13, wherein the first conductive layer is arranged in the second sub-peripheral area.

15. The display apparatus of claim 14, wherein the pixel comprises:
a thin film transistor configured to be turned on in response to the driving signal; and
a pixel electrode electrically connected to the thin film transistor,
wherein the thin film transistor comprises:
a gate electrode branching from the gate line;
a semiconductor pattern overlapping the gate electrode;
a source electrode branching from the data line and overlapping the semiconductor pattern; and
a drain electrode spaced apart from the source electrode and overlapping the semiconductor pattern, wherein the first driver comprises at least one thin film transistor including at least one electrode having a same thickness as the gate line, at least one electrode having a same thickness as the data line, and an active pattern having a same thickness as the semiconductor pattern.

16. The display apparatus of claim 15, further comprising a dummy semiconductor layer having a same thickness as the semiconductor pattern, wherein the dummy semiconductor layer is arranged under the data line and the second conductive layer.

17. The display apparatus of claim 13, wherein the data line comprises:
a lower conductive layer comprising a same material as the gate line;
an upper conductive layer comprising a same material as the data line, the upper conductive layer disposed on the lower conductive layer and an insulating layer; and
a connection electrode electrically connecting the upper conductive layer to the lower conductive layer through an opening in the upper conductive layer and the insulating layer.

18. The display apparatus of claim 17, further comprising a coupling member disposed between the first base substrate and the second base substrate in the peripheral area to cover the first driver and couple the first base substrate to the second base substrate, wherein the connection electrode is positioned in the second sub-peripheral area and overlaps the coupling member.

19. The display apparatus of claim 17, wherein the data bonding area is spaced apart from the display area by the second sub-peripheral area;
wherein the second driver is electrically connected to the data line in the data bonding area to apply the data signal to the data line, and wherein the connection electrode is positioned in the data bonding area.

20. The display apparatus of claim 1, further comprising a liquid crystal layer disposed between the first base substrate and the second base substrate.

21. A display apparatus comprising:
a first base substrate comprising a display area, a peripheral area adjacent to the display area, and a data bonding area, the peripheral area including a first peripheral area and a second peripheral area;
a second base substrate coupled to the first base substrate;
a pixel arranged in the display area;
a first driver arranged in the first peripheral area and configured to apply a driving signal to the pixel through a gate line;
a second driver arranged in the data bonding area of the first base substrate and configured to apply a data signal to the pixel through a data line; and
a cell gap compensation pattern arranged between the first base substrate and the second base substrate,
wherein the second peripheral area includes fan-out areas and fan-out peripheral areas, and each of the fan-out peripheral areas is arranged between two adjacent fan-out areas among the fan-out areas,
wherein the data line is arranged on the first base substrate extending from the second driver to the pixel across the fan-out areas, and electrically connected to the second driver to apply the data signal to the pixel, wherein the cell gap compensation pattern is disposed in the second peripheral area except the fan-out areas without overlapping the gate line and the data line, and wherein the cell gap compensation pattern has a round shape when viewed in a plan view.

* * * * *